US012699209B2

(12) United States Patent
Ko et al.

(10) Patent No.: US 12,699,209 B2
(45) Date of Patent: Aug. 4, 2026

(54) DISPLAY APPARATUS HAVING A LIGHT-EMITTING DEVICE

(71) Applicant: LG Display Co., Ltd., Seoul (KR)

(72) Inventors: Jeong Hoon Ko, Paju-si (KR); Do Yeon Kim, Paju-si (KR); Seung Jae Lee, Paju-si (KR); Dong Geun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 423 days.

(21) Appl. No.: 18/528,482

(22) Filed: Dec. 4, 2023

(65) Prior Publication Data

US 2024/0219606 A1 Jul. 4, 2024

(30) Foreign Application Priority Data

Dec. 30, 2022 (KR) ......................... 10-2022-0190766

(51) Int. Cl.
| *G02B 1/11* | (2015.01) |
| *G02B 5/30* | (2006.01) |
| *H10K 59/80* | (2023.01) |

(52) U.S. Cl.
CPC .............. *G02B 1/11* (2013.01); *G02B 5/3025* (2013.01); *G02B 5/3083* (2013.01); *H10K 59/873* (2023.02); *H10K 59/8792* (2023.02)

(58) Field of Classification Search
CPC ...... G02B 1/11; G02B 5/3025; G02B 5/3083; G02B 1/115; H10K 50/865; H10K 50/86; H10K 59/8791; H10K 59/8793; H10K 50/868
See application file for complete search history.

(56) References Cited

U.S. PATENT DOCUMENTS

| 2016/0351856 A1* | 12/2016 | Jung | ....................... H10K 50/86 |
| 2017/0102491 A1* | 4/2017 | Lee | ....................... G02B 5/3033 |

FOREIGN PATENT DOCUMENTS

| KR | 10-2016-0047894 A | 5/2016 |
| KR | 10-2017-0068861 A | 6/2017 |
| KR | 10-2019-0074512 A | 6/2019 |
| KR | 10-2020-0075489 A | 6/2020 |
| KR | 10-2022-0069304 A | 5/2022 |

* cited by examiner

*Primary Examiner* — Wasiul Haider

(74) *Attorney, Agent, or Firm* — Birch, Stewart, Kolasch & Birch, LLP

(57) ABSTRACT

Discussed is a display apparatus that can include an encapsulation unit covering a light-emitting device and an optical unit on the encapsulation unit. The optical unit can control viewing angle of the light emitted from the light-emitting device. For example, the optical unit can include a linear polarizer, a dichroic dye layer disposed on the linear polarizer and an optical compensation layer disposed between the linear polarizer and the dichroic dye layer. Thus, in the display apparatus, the viewing angle of the dichroic dye layer can be compensated by an in-plane phase retardation value (Rin) and/or a thickness direction phase retardation value (Rth) according to a type of the optical compensation layer.

20 Claims, 9 Drawing Sheets

PA

FIG. 6 black luminance (arb.)

azimuth angle (°)

None
Rth 360
Rth 420
Rth 460
Rth 500

FIG. 7

DISPLAY APPARATUS HAVING A LIGHT-EMITTING DEVICE

CROSS-REFERENCE TO RELATED APPLICATIONS

This application claims priority to Korean Patent Application No. 10-2022-0190766, filed in the Republic of Korea on Dec. 30, 2022, the entire contents of which is hereby expressly incorporated by reference into the present application.

BACKGROUND OF THE DISCLOSURE

Field of the Disclosure

The present disclosure relates to a display apparatus in which an image is realized by light emitted from a light-emitting device.

Discussion of the Related Art

Generally, a display apparatus provides an image to a user. For example, the display apparatus can include a plurality of light-emitting devices to generate light in a self-illuminating display. Each of the light-emitting devices can emit light displaying a specific color. For example, each of the light-emitting devices can include a light-emitting layer disposed between a first electrode and a second electrode in various display devices, such as an organic light emitting display device.

The image realized or provided by the display apparatus can be too dim and not recognized by people around the user when the display apparatus is used in a setting with bright external light. To address this issue, the display apparatus can restrict a traveling direction of the light emitted from each light-emitting device by using a light control film (LCF) having light-blocking patterns, which extend in a direction. However, in the display apparatus with such LCF, a Moire and/or a spot can occur due to light-blocking patterns. Therefore, in the display apparatus, a quality of the image realized to have a narrow viewing angle can be degraded.

SUMMARY OF THE DISCLOSURE

Accordingly, the present disclosure is directed to a display apparatus that substantially obviates one or more problems due to limitations and disadvantages of the related art.

An object of the present disclosure is to provide a display apparatus capable of realizing the narrow viewing angle, without the occurrence of the Moire.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. A light-emitting device and an encapsulation unit are disposed on a device substrate. The encapsulation unit covers the light-emitting device. An anti-reflection layer is disposed on the encapsulation unit. A dichroic dye layer is disposed on the anti-reflection layer. The dichroic dye layer includes dyes vertically arranged. A linear polarizer is disposed between the anti-reflection layer and the dichroic dye layer. A first optical compensation layer is disposed between the linear polarizer and the dichroic dye layer.

The anti-reflection layer can include a ¼ wave plate.

The first optical compensation layer can include a positive B plate.

An in-plane phase retardation value (Rin) of the first optical compensation layer can be 120 nm to 230 nm.

A thickness direction phase retardation value (Rth) of the first optical compensation layer can be 360 nm to 500 nm.

A second optical compensation layer can be disposed between the first optical compensation layer and the dichroic dye layer.

The second optical compensation layer is a retardation film having a different relationship between at least two of an in-plane refractive index in a first axis, an in-plane refractive index in a second axis different from the first axis, and a refractive index in a thickness direction, from the first optical compensation layer.

The first optical compensation layer can include a negative B plate. The second optical compensation layer can include a positive B plate.

An in-plane phase retardation value (Rin) of each of the first optical compensation layer and the second optical compensation layer can be 115 nm to 120 nm.

A thickness direction phase retardation value (Rth) of each of the first optical compensation layer and the second optical compensation layer can be 100 nm to 105 nm.

The first optical compensation layer can include a positive A plate. The second optical compensation layer can include a positive C plate.

An in-plane phase retardation value (Rin) of each of the first optical compensation layer and the second optical compensation layer can be 125 nm to 145 nm.

A thickness direction phase retardation value (Rth) of each of the first optical compensation layer and the second optical compensation layer can be 80 nm to 100 nm.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIG. 6 is a view of graphs showing black luminance according to an azimuth angle depending on thickness direction phase retardation value (Rth) of the optical compensation layer made of a positive B plate in the display apparatus which does not include an optical compensation layer and the display apparatus according to the embodiment of the present disclosure;

FIG. 7 is a view showing the optical compensation layer in the display apparatus according to another embodiment of the present disclosure;

DETAILED DESCRIPTION OF THE EMBODIMENTS

Figure 1:
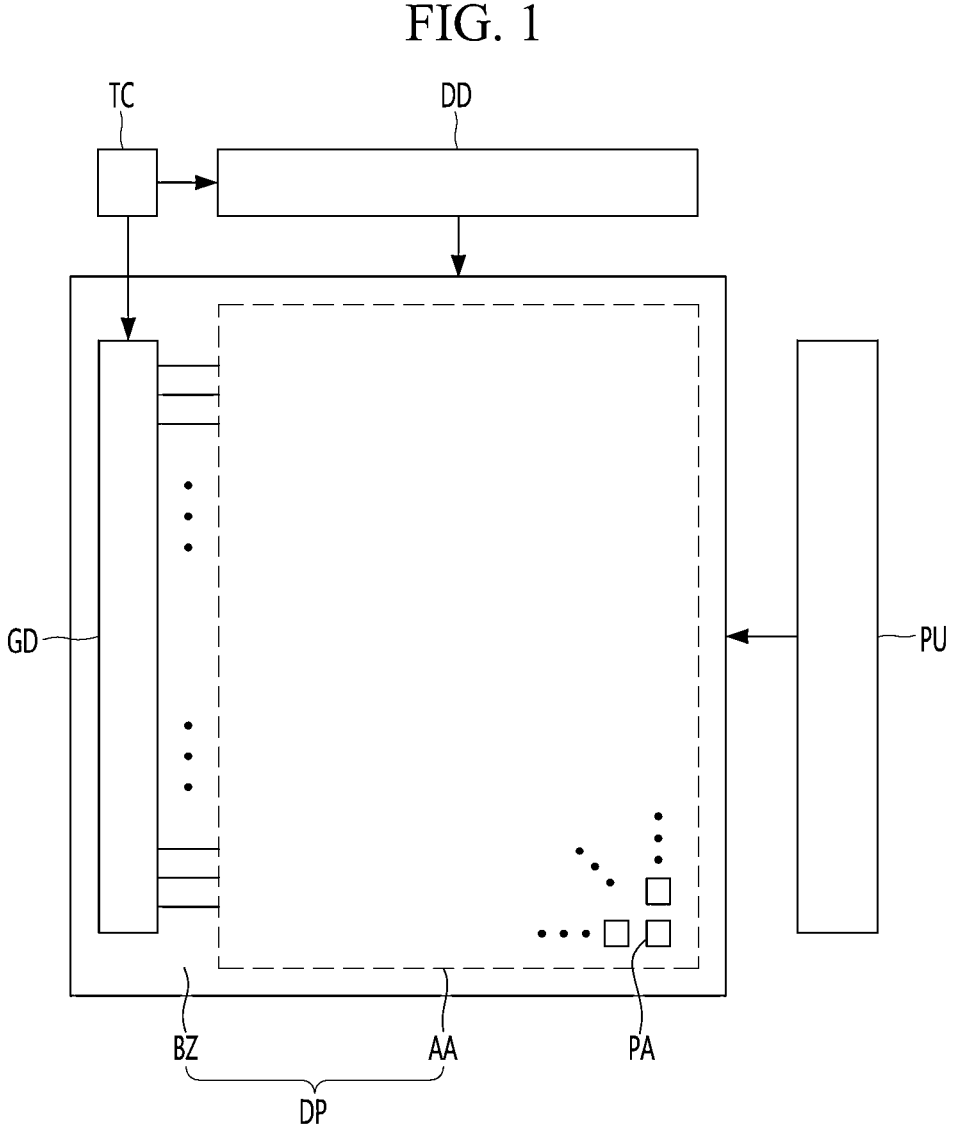
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure can be embodied in other forms and is not limited to the embodiments described below.

In addition, the same or extremely similar elements can be designated by the same reference numerals throughout the specification and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element and may not define order or sequence. However, the first element and the second element can be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" can include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENTS

Figure 2:
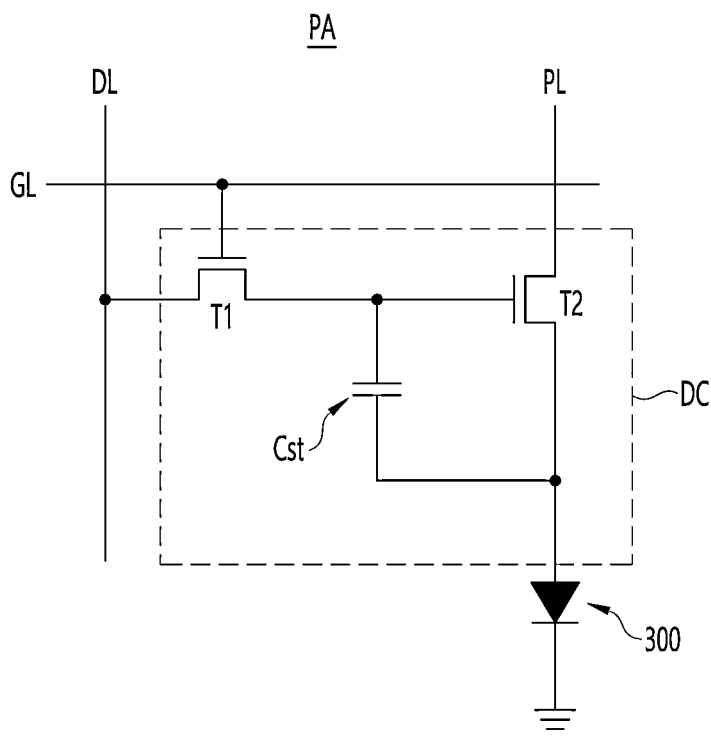
FIG. 2 is a view showing a circuit of a unit pixel area in the display apparatus according to the embodiment of the present disclosure.

FIG. 1 is a view schematically showing a display apparatus according to an embodiment of the present disclosure. FIG. 2 is a view showing a circuit of a unit pixel area in the display apparatus according to the embodiment of the present disclosure.

Referring to FIGS. 1 and 2, the display apparatus according to the embodiment of the present disclosure can include a display panel DP. The display panel DP can generate an image provided to a user. For example, the display panel DP can include a plurality of pixel areas PA. All components of each display apparatus according to all embodiments of the present disclosure are operatively coupled and configured.

Various signals can be applied to each pixel area PA through signal wirings GL, DL and PL. For example, the signal wirings GL, DL and PL can include gate lines GL applying a gate signal to each pixel area PA, data lines DL applying a data signal to each pixel area PA, and power voltage supply lines PL supplying a power voltage to each pixel area PA. Each of the pixel areas PA can be electrically connected to the gate driver GD through one of the gate lines GL. Each of the pixel areas PA can be electrically connected to the data driver DD through one of the data lines DL. Each of the pixel areas PA can be electrically connected to the power unit PU through one of the power voltage supply lines PL. The gate driver GD and the data driver DD can be controlled by a timing controller TC. For example, the gate driver GD can receive clock signals, reset signals and a start signal from the timing controller TC, and the data driver DD can receive digital video data and a source timing signal from the timing controller TC.

The display panel DP can include the display area AA in which the pixel areas PA are disposed, and a bezel area BZ disposed outside the display area AA. At least one of the gate driver GD, the data driver DD, the power unit PU and the timing controller TC can be disposed on the bezel area BZ of the display panel DP. For example, the display apparatus according to the embodiment of the present disclosure can be a GIP (Gate In Panel) type display apparatus in which the gate driver GD is formed on the bezel area BZ of the display panel DP.

Each of the pixel areas PA can realize a specific color. For example, a pixel driving circuit DC electrically connected to a light-emitting device 300 can be disposed in each pixel area PA. The pixel driving circuit DC of each pixel area PA can supply a driving current corresponding to the data signal to the light-emitting device 300 of the corresponding pixel area PA according to gate signal for one frame. For example, the pixel driving circuit DC of each pixel area PA can include a first thin film transistor T1, a second thin film transistor T2 and a storage capacitor Cst.

Figure 3:
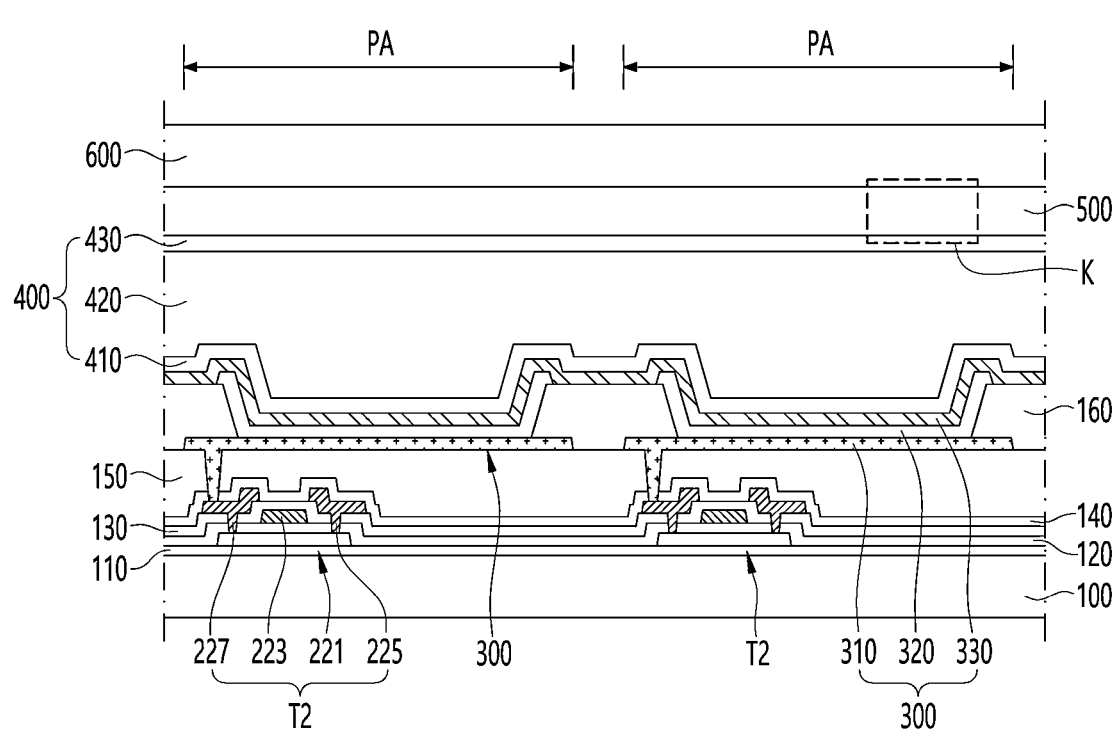
FIG. 3 is a view schematically showing a cross-section of a pixel area in the display apparatus according to the embodiment of the present disclosure.
Figure 4:
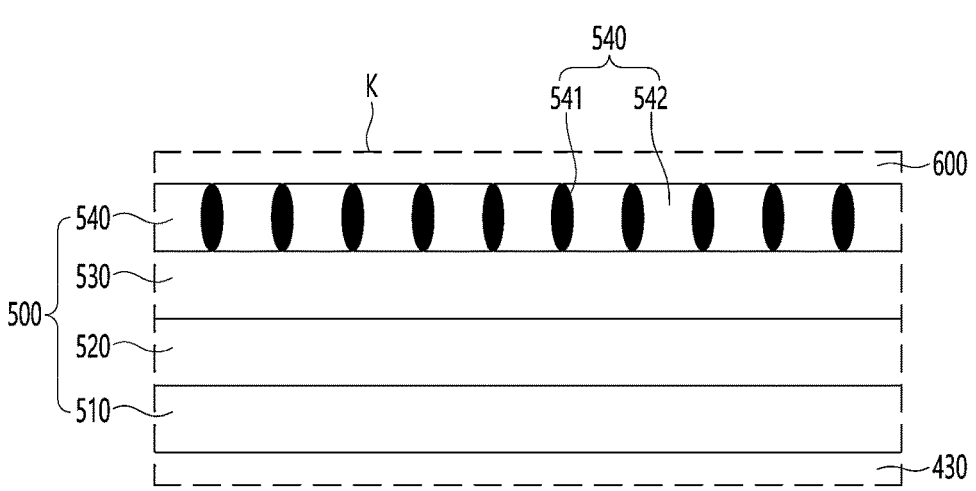
FIG. 4 is an enlarged view of K region in FIG. 3.

FIG. 3 is a view schematically showing a cross-section of a pixel area in the display apparatus according to the embodiment of the present disclosure.

Referring to FIGS. 2 and 3, the first thin film transistor T1 can include a first semiconductor pattern, a first gate electrode, a first source electrode and a first drain electrode. The first thin film transistor T1 can transmit the data signal to the second thin film transistor T2 according to the gate signal. For example, the first thin film transistor T1 can be a switching thin film transistor. The first gate electrode can be electrically connected to the gate line GL, and the first source electrode can be electrically connected to the date line DL.

The first semiconductor pattern can include a semiconductor material. For example, the first semiconductor pattern can include amorphous silicon (a-Si), polycrystalline silicon (Poly-Si) or an oxide semiconductor, such as IGZO. The first semiconductor pattern can include a first source region, a first channel region and a first drain region. The first channel region can be disposed between the first source region and the first drain region. A resistance of the first source region and a resistance of the first drain region can be smaller than a resistance of the first channel region. For example, the first source region and the first drain region can include a conductive region of an oxide semiconductor. The first channel region can be a region of an oxide semiconductor, which is not conductorized or become conductive.

The first gate electrode can include a conductive material. For example, the first gate electrode can include a metal, such as aluminum (Al), chrome (Cr), copper (Cu), molybdenum (Mo), titanium (Ti) and tungsten (W). But embodiments of the present disclosure are not limited thereto. The first gate electrode can be disposed on the first semiconductor pattern. For example, the first gate electrode can overlap the first channel region of the first semiconductor pattern. The first source region and the first drain region of the first semiconductor pattern can be disposed outside the first gate electrode. The first gate electrode can be insulated from the first semiconductor pattern. For example, the first source region of the first semiconductor pattern can be electrically connected to the first drain region of the first semiconductor pattern according to the gate signal.

The first source electrode can include a conductive material. For example, the first source electrode can include a metal, such as aluminum (Al), chrome (Cr), copper (Cu), molybdenum (Mo), titanium (Ti) and tungsten (W). But embodiments of the present disclosure are not limited thereto. The first source electrode can include a material different from the first gate electrode. The first source electrode can be disposed on a layer different from the first gate electrode. For example, the first source electrode can be insulated from the first gate electrode. The first source electrode can be electrically connected to the first source region of the first semiconductor pattern.

The first drain electrode can include a conductive material. For example, the first drain electrode can include a metal, such as aluminum (Al), chrome (Cr), copper (Cu), molybdenum (Mo), titanium (Ti) and tungsten (W). But embodiments of the present disclosure are not limited thereto. The first drain electrode can include a material different from the first gate electrode. The first drain electrode can be disposed on a layer different from the first gate electrode. For example, the first drain electrode can be disposed on a same layer as the first source electrode. The first drain electrode can include a same material as the first source electrode. The first drain electrode can be insulated from the first gate electrode. For example, the first drain electrode can be electrically connected to the first drain region of the first semiconductor pattern.

The second thin film transistor T2 can include a second semiconductor pattern 221, a second gate electrode 223, a second source electrode 225 and a second drain electrode 227. The second thin film transistor T2 can generate the driving current corresponding to the data signal. For example, the second thin film transistor T2 can be a driving thin film transistor. The second gate electrode 223 can be electrically connected to the first drain electrode, and the second source electrode 225 can be electrically connected to one of the power voltage supply lines PL. The light-emitting device 300 can be electrically connected to the second thin film transistor T2. For example, the light-emitting device 300 can be electrically connected to the second drain electrode 227 of the second thin film transistor T2.

The second semiconductor pattern 221 can include a semiconductor material. For example, the second semiconductor pattern 221 can include amorphous silicon (a-Si), polycrystalline silicon (poly-Si) or an oxide semiconductor, such as IGZO. But embodiments of the present disclosure are not limited thereto. The second semiconductor pattern 221 can include a second channel region between a second source region and a second drain region. The second channel region can have a resistance larger than the second source region and the second drain region. For example, the second source region and the second drain region can include a conductive region of an oxide semiconductor, and the second channel region can be a region of an oxide semiconductor, which is not conductorized or become conductive.

The second semiconductor pattern 221 can be disposed on a same layer as the first semiconductor pattern. The second semiconductor pattern 221 can include a same material as the first semiconductor pattern. For example, the second semiconductor pattern 221 can be formed simultaneously with the first semiconductor pattern.

The second gate electrode 223 can include a conductive material. For example, the second gate electrode 223 can include a metal, such as aluminum (Al), chrome (Cr), copper (Cu), molybdenum (Mo), titanium (Ti) and tungsten (W). But embodiments of the present disclosure are not limited thereto. The second gate electrode 223 can be disposed on a same layer as the first gate electrode. The second gate electrode 223 can include a same material as the first gate electrode. For example, the second gate electrode 223 can be formed simultaneously with the first gate electrode.

The second gate electrode 223 can be disposed on the second semiconductor pattern 221. For example, the second gate electrode 223 can overlap the second channel region of the second semiconductor pattern 221. The second source region and the second drain region of the second semiconductor pattern 221 can be disposed outside the second gate electrode 223. The second gate electrode 223 can be insulated from the second semiconductor pattern 221. For example, the second channel region of the second semiconductor pattern 221 can have an electrical conductivity corresponding to a voltage applied to the second gate electrode 223. But embodiments of the present disclosure are not limited thereto.

The second source electrode 225 can include a conductive material. For example, the second source electrode 225 can include a metal, such as aluminum (Al), chrome (Cr), copper (Cu), molybdenum (Mo), titanium (Ti) and tungsten (W). But embodiments of the present disclosure are not limited thereto. The second source electrode 225 can include a material different from the second gate electrode 223. The second source electrode 225 can be disposed on a layer different from the second gate electrode 223. For example, the second source electrode 225 can be insulated from the second gate electrode 223. The second source electrode 225 can be electrically connected to the second source region of the second semiconductor pattern 221.

The second source electrode 225 can be disposed on a same layer as the first source electrode. The second source electrode 225 can include a same material as the first source electrode. For example, the second source electrode 225 can be formed simultaneously with the first source electrode.

The second drain electrode 227 can include a conductive material. For example, the second drain electrode 227 can include a metal, such as aluminum (Al), chrome (Cr), copper (Cu), molybdenum (Mo), titanium (Ti) and tungsten (W). But embodiments of the present disclosure are not limited thereto. The second drain electrode 227 can include a material different from the second gate electrode 223. The second drain electrode 227 can be disposed on a layer different from the second gate electrode 223. For example, the second drain electrode 227 can be insulated from the second gate electrode 223. The second drain electrode 227 can be electrically connected to the second drain region of the second semiconductor pattern 221.

The second drain electrode 227 can be disposed on a same layer as the first drain electrode. For example, the second drain electrode 227 can include a same material as the first drain electrode. For example, the second drain electrode 227 can be formed simultaneously with the first drain electrode. But embodiments of the present disclosure are not limited thereto.

The storage capacitor Cst can maintain a signal applied to the second gate electrode 223 of the second thin film transistor T2 for one frame. For example, the storage capacitor Cst can be electrically connected between the second gate electrode 223 and the second drain electrode 227 of the second thin film transistor T2. The storage capacitor Cst can have a stacked structure of capacitor electrodes. The storage capacitor Cst can be formed using a process of forming the first thin film transistor T1 and the second thin film transistor T2. For example, the storage capacitor Cst can include a first capacitor electrode disposed on a same layer as the first gate electrode 223 and a second capacitor electrode disposed on a same layer as the second drain electrode 227.

The pixel driving circuit DC of each pixel area PA can be disposed on a device substrate 100. The device substrate 100 can include an insulating material. For example, the device substrate 100 can include glass or plastic. But embodiments of the present disclosure are not limited thereto.

A plurality of insulating layers 110, 120, 130, 140, 150 and 160 for preventing unnecessary electrical connection in each pixel area PA can be disposed on the device substrate 100. For example, a device buffer layer 110, a gate insulating layer 120, an interlayer insulating layer 130, a device passivation layer 140, a planarization layer 150 and a bank insulating layer 160 can be disposed on the device substrate 100.

The device buffer layer 110 can be disposed close to the device substrate 100. The device buffer layer 110 can prevent pollution due to the device substrate 100 in a process of forming the pixel driving circuit DC in each pixel area PA. For example, a surface of the device substrate 100 can be completely covered by the device buffer layer 110. The pixel driving circuit DC of each pixel area PA can be disposed on the device buffer layer 110. The device buffer layer 110 can include an insulating material. For example, the device buffer layer 110 can include an inorganic insulating material, such as silicon oxide (SiOx) and silicon nitride (SiNx). The device buffer layer 110 can have a multi-layer structure. For example, the device buffer layer 110 can have a stacked structure of an inorganic insulating layer made of silicon oxide (SiOx) and an inorganic insulating layer made of silicon nitride (SiNx). But embodiments of the present disclosure are not limited thereto.

The gate insulating layer 120 can insulate the gate electrodes 223 of each pixel area PA from the corresponding semiconductor pattern 221. For example, the first semiconductor pattern and the second semiconductor pattern 221 of each pixel area PA can be covered by the gate insulating layer 120. The first gate electrode and the second gate electrode 223 of each pixel area PA can be disposed on the gate insulating layer 120. The gate insulating layer 120 can include an insulating material. For example, the gate insulating layer 120 can include an inorganic insulating material, such as silicon oxide (SiOx). But embodiments of the present disclosure are not limited thereto.

The interlayer insulating layer 130 can be disposed on the gate insulating layer 120. The drain electrodes 225 and the source electrodes 227 of each pixel area PA can be insulated from the corresponding gate electrode 223 by the interlayer insulating layer 130. For example, the first gate electrode and the second gate electrode 223 of each pixel area PA can be covered by the interlayer insulating layer 130. The first source electrode, the first drain electrode, the second source electrode 225 and the second drain electrode 227 of each pixel area PA can be disposed on the interlayer insulating layer 130 of the corresponding pixel area PA. The interlayer insulating layer 130 can include an insulating material. For example, the interlayer insulating layer 130 can include an inorganic insulating material, such as silicon oxide (SiOx) and silicon nitride (SiNx). But embodiments of the present disclosure are not limited thereto.

The device passivation layer 140 can be disposed on the interlayer insulating layer 130. The device passivation layer 140 can prevent damage of the pixel driving circuit DC in each pixel area PA due to external moisture and impact. For example, the first source electrode, the first drain electrode, the second source electrode 225 and the second drain electrode 227 of each pixel area PA can be covered by the device passivation layer 140. The device passivation layer 140 can include an insulating material. For example, the device passivation layer 140 can include an inorganic insulating material, such as silicon oxide (SiOx) and silicon nitride (SiNx). But embodiments of the present disclosure are not limited thereto.

The planarization layer 150 can be disposed on the device passivation layer 140. The planarization layer 150 can remove a thickness difference due to the pixel driving circuit DC of each pixel area PA. For example, an upper surface of the planarization layer 150 opposite to the device substrate 100 can be a flat surface. The planarization layer 150 can include an insulating material. The planarization layer 150 can include a material different from the device passivation layer 140. For example, the planarization layer 150 can be an organic insulating material. But embodiments of the present disclosure are not limited thereto.

The light-emitting device 300 of each pixel area PA can emit light displaying a specific color. For example, the light-emitting device 300 of each pixel area PA can have a stacked structure of a first electrode 310, a light-emitting layer 320 and a second electrode 330. The light-emitting device 300 of each pixel area PA can be disposed on the planarization layer 150 of the corresponding pixel area PA. For example, the first electrode 310, the light-emitting layer 320 and the second electrode 330 of the light-emitting device 300 in each pixel area PA can be sequentially stacked on the upper surface of the planarization layer 150 in the corresponding pixel area PA.

The first electrode 310 can include a conductive material. The first electrode 310 can include a material having a high reflectance. For example, the first electrode 310 can include a metal, such as aluminum (Al) and silver (Ag). The first electrode 310 can have a multi-layer structure. For example, the first electrode 310 can have a structure in which a reflective electrode made of a metal is disposed between transparent electrodes made of a transparent conductive material, such as ITO and IZO. But embodiments of the present disclosure are not limited thereto.

The light-emitting layer 320 can generate light having luminance corresponding to a voltage difference between the first electrode 310 and the second electrode 330. For example, the light-emitting layer 320 can include an emission material layer (EML) having an emission material. The emission material can include an organic material, an inorganic material or a hybrid material. For example, the display apparatus according to the embodiment of the present disclosure can be an organic light-emitting display apparatus including an organic emission material. But embodiments of the present disclosure are not limited thereto.

The light-emitting layer 320 can have a multi-layer structure. For example, the light-emitting layer 320 can further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 can be improved.

The second electrode 330 can include a conductive material." The second electrode 330 can include a material different from the first electrode 310. A transmittance of the second electrode 330 can be higher than a transmittance of the first electrode 310. For example, the second electrode 330 can be a transparent electrode made of a transparent conductive material, such as ITO and IZO, or a translucent electrode in which metals such as Ag and Mg are thinly formed. But embodiments of the present disclosure are not limited thereto. Thus, in the display apparatus according to the embodiment of the present disclosure, the light generated by the light-emitting layer 320 can be emitted outside through the second electrode 330.

The light-emitting device 300 of each pixel area PA can be electrically connected to the second thin film transistor T2 of the pixel driving circuit DC in the corresponding pixel area PA. For example, the second drain electrode 227 of each pixel area PA can be electrically connected to the first electrode 310 of the corresponding pixel area PA. The device passivation layer 140 and the planarization layer 150 can include electrode contact holes partially exposing the second drain electrode 227 of each pixel area PA. The first electrode 310 of each pixel area PA can be in direct contact with the second drain electrode 227 of the corresponding pixel area PA through one of the electrode contact holes. The first electrode 310 of each pixel area PA can be in direct contact with the upper surface of the planarization layer 150. Thus, in the display apparatus according to the embodiment of the present disclosure, luminance deviation according to the generating location of the light emitted from each light-emitting device 300 can be prevented.

A bank insulating layer 160 can be disposed on the planarization layer 150. The bank insulating layer 160 can define an emission area in each pixel area PA. For example, the bank insulating layer 160 can cover an edge of the first electrode 310 in each pixel area PA. The light-emitting layer 320 and the second electrode 330 of each pixel area PA can be sequentially stacked on a portion of the corresponding first electrode 310 exposed by the bank insulating layer 160. The bank insulating layer 160 can include an insulating material. For example, the bank insulating layer 160 can include an organic insulating material. The bank insulating layer 160 can include a material different from the planarization layer 150. The first electrode 310 of each pixel area PA can be insulated from the first electrode 310 of adjacent pixel area PA by the bank insulating layer 160.

Each of the pixel areas PA can realize a color different from adjacent pixel area PA. For example, the light-emitting layer 320 of each pixel area PA can be spaced apart from the light-emitting layer 320 of adjacent pixel area PA. The light-emitting layer 320 of each pixel area PA can include an end on the bank insulating layer 160. For example, the light-emitting layer 320 of each pixel area PA can be individually formed using a fine metal mask (FMM).

A voltage applied to the second electrode 330 of each pixel area PA can be a same as a voltage applied to the second electrode 330 of adjacent pixel area PA. For example, the second electrode 330 of each pixel area PA can be electrically connected to the second electrode 330 of adjacent pixel area PA. The second electrode 330 of each pixel area PA can include a same material as the second electrode 330 of adjacent pixel area PA. For example, the second electrode 330 of each pixel area PA can be formed simultaneously with the second electrode 330 of adjacent pixel area PA. The second electrode 330 of each pixel area PA can be in direct contact with the second electrode 330 of adjacent pixel area PA. For example, the second electrode 330 of each pixel PA can extend onto the bank insulating layer 160. The bank insulating layer 160 can be covered by the second electrode 330. Thus, in the display apparatus according to the embodiment of the present disclosure, a process of forming the second electrode 330 in each pixel area PA can be simplified. Further, in the display apparatus according to the embodiment of the present disclosure, the luminance of the light emitted from the light-emitting device 300 of each pixel area PA can be adjusted by the data signal applied to the pixel driving circuit DC of the corresponding pixel area PA.

An encapsulation unit 400 can be disposed on the light-emitting device 300 of each pixel area PA. The encapsulation unit 400 can prevent damages of the light-emitting devices 300 due to external moisture and impact. The encapsulation unit 400 can have a multi-layer structure. For example, the encapsulation unit 400 can include a first encapsulating layer 410, a second encapsulating layer 420 and a third encapsulating layer 430, which are sequentially stacked. The first encapsulating layer 410, the second encapsulating layer 420 and the third encapsulating layer 430 can include an insulating material. The second encapsulating layer 420 can include a material different from the first encapsulating layer 410 and the third encapsulating layer 430. For example, the first encapsulating layer 410 and the third encapsulating layer 430 can include an inorganic insulating material, such as silicon oxide (SiOx) and silicon nitride (SiNx), and the second encapsulating layer 420 can include an organic insulating material. But embodiments of the present disclosure are not limited thereto. Thus, in the display apparatus according to the embodiment of the present disclosure, the damages of the light-emitting devices 300 due to external moisture and impact can be effectively prevented.

An optical unit 500 can be disposed on the encapsulation unit 400. The optical unit 500 can restrict a traveling direction of the light emitted from each light-emitting device 300. The optical unit 500 can prevent reflection of external light introduced in the direction of each light-emitting device 300. For example, the optical unit 500 can include an anti-reflection layer 510, a linear polarizer 520, an optical compensation layer 530 and a dichroic dye layer 540, which are sequentially stacked.

The anti-reflection layer 510 and the linear polarizer 520 can prevent the external light introduced in the direction of the device substrate 100 through the encapsulation unit 400 from emitting by reflection. For example, the anti-reflection layer 510 can include a ¼ wave plate. The ¼ wave plate can mean a N4 phase retardation film or a Quarter Wave Plate (QWP). Thus, in the display apparatus according to the embodiment of the present disclosure, the external light linearly polarized by the linear polarizer 520 can be circularly polarized by the anti-reflection layer 510. For example, the external light introduced into the encapsulation unit 400 through the linear polarizer 520 and the anti-reflection layer 510 can be left-circularly polarized light. The light circularly polarized by the anti-reflection layer 510 can be reflected by the first electrode 310 of each light-emitting device 300 and/or the signal wirings GL and DL. The rotational direction of the circularly polarized light can be reversed by reflection. The left-circularly polarized light by the linear polarizer 510 and the anti-reflection layer 510 can be reflected by the first electrode 310 of each light emitting device 300 and/or the signal wires GL and DL, such that left-circularly polarized light by the linear polarizer 510 and the anti-reflection layer 510 can be changed to right-circularly polarized light. The right-circularly polarized light by the first electrode 310 of each light emitting device 300 and/or the signal wires GL and DL need not pass through the anti-reflection layer 510 and the linear polarizer 520. Therefore, in the display apparatus according to the embodiment of the present disclosure, the deterioration of the image by the reflection of the external light can be prevented by the anti-reflection layer 510 and the linear polarizer 520.

The dichroic dye layer 540 can include dyes 541 vertically arranged and a transparent insulating layer 542 surrounding the dyes 541. The dyes 541 can have opaque colors. For example, the dyes 541 can include a black dye. Thus, in the display apparatus according to the embodiment of the present disclosure, the external light traveling toward the device substrate 100 can be partially absorbed by the dyes 541. Therefore, in the display apparatus according to the embodiment of the present disclosure, the deterioration of the image by the reflection of the external light can be effectively prevented.

The dichroic dye layer 540 can overlap the display area AA. The dyes 541 can be arranged in a direction. For example, the dyes 541 can be arranged side by side in a first direction or a horizontal direction. Thus, in the display apparatus according to the embodiment of the present disclosure, light traveling in a second direction perpendicular to the first direction can be absorbed and/or blocked by the dyes 541. For example, in the display apparatus according to the embodiment of the present disclosure, a viewing angle in the second direction can be restricted by the dichroic dye layer 540. Therefore, in the display apparatus according to the embodiment of the present disclosure, a narrow viewing angle can be realized by the dichroic dye layer 540.

Each of the dyes 541 can be spaced apart from adjacent dye 541. Thus, in the display apparatus according to the embodiment of the present disclosure, the occurrence of Moire due to the dyes 541 can be prevented. Therefore, in the display apparatus according to the embodiment of the present disclosure, the narrow viewing angle can be realized without the occurrence of the Moire.

In various embodiments of the present disclosure, the dyes 541 can be arranged side by side in the dichroic dye layer 540. But embodiments of the present disclosure are not limited thereto. For example, in addition to being side by side, the dyes 541 can also be arranged in stacks, so that the dyes 541 can be arranged on top of one another in a second direction or a vertical direction at the same time as being arranged side by side in the first direction or the horizontal direction.

The optical compensation layer 530 can compensate a decrease in the viewing angle characteristics due to a gap between the dyes 541. For example, the optical compensation layer 530 can include a positive B plate. When, nx means the refractive index in a direction of the axis having the largest refractive index in the plane of the plate, ny means the refractive index in a direction perpendicular to nx in the plane of the plate, and nz means the refractive index in a thickness direction of the plate, a refractive index ratio (Nz) of the plate, an in-plane phase retardation value (Rin), and a thickness direction phase retardation value (Rth) can be defined by the following equations. For example, the positive B plate is a retardation film having a relationship of nz>nx>ny. Here, d can mean a thickness of the plate.

$$Nz = Rth / Rin \qquad \text{[Equation]}$$
$$Rin = (nx - ny) / d$$
$$Rth = (nx - nz) / d$$

In various embodiments of the present disclosure, the optical unit 500 can include an anti-reflection layer 510, a linear polarizer 520, an optical compensation layer 530 and a dichroic dye layer 540, which are sequentially stacked, but the embodiments of the present disclosure are not limited thereto. In other embodiments of the present disclosure, the optical unit 500 can include only some of the anti-reflection layer 510, the linear polarizer 520, the optical compensation layer 530 and the dichroic dye layer 540. In various embodiments of the present disclosure, the optical unit can include the dichroic dye layer and one or both of optical compensation layer 530 and the liner polarizer.

Figure 5:
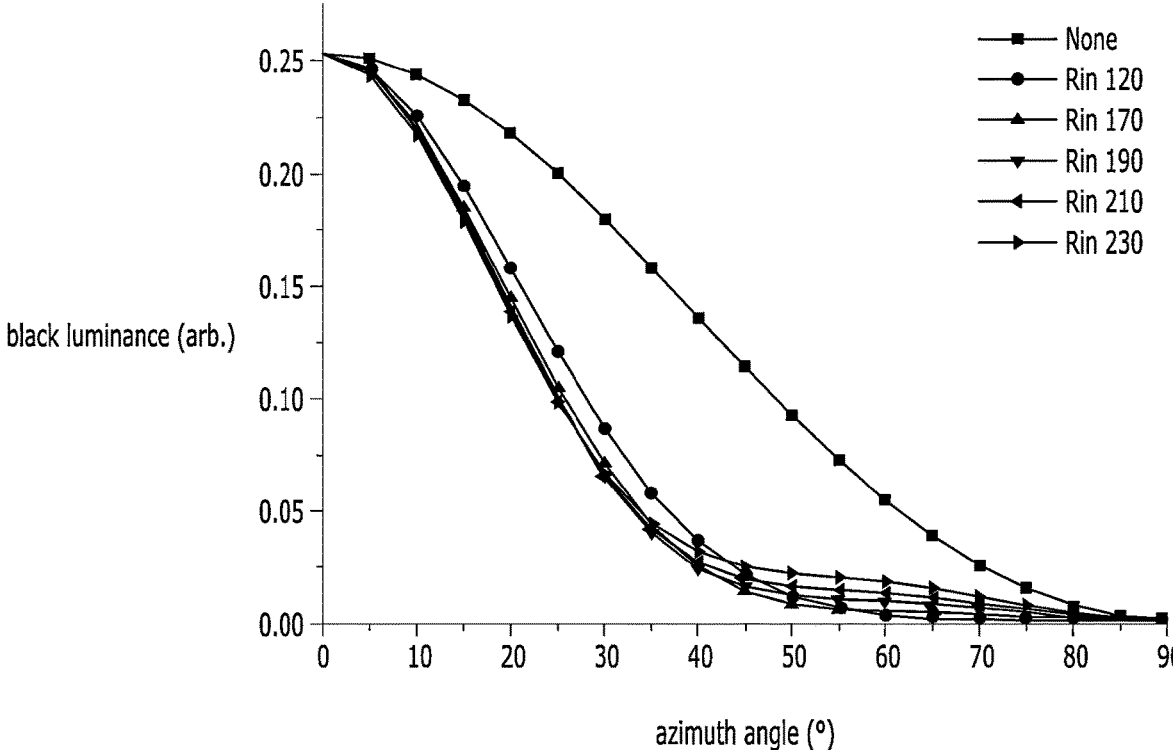
FIG. 5 is a view of graphs showing black luminance according to an azimuth angle depending on in-plane phase retardation value (Rin) of the optical compensation layer made of a positive B plate in the display apparatus which does not include an optical compensation layer and the display apparatus according to the embodiment of the present disclosure.
Figures 6, 7:
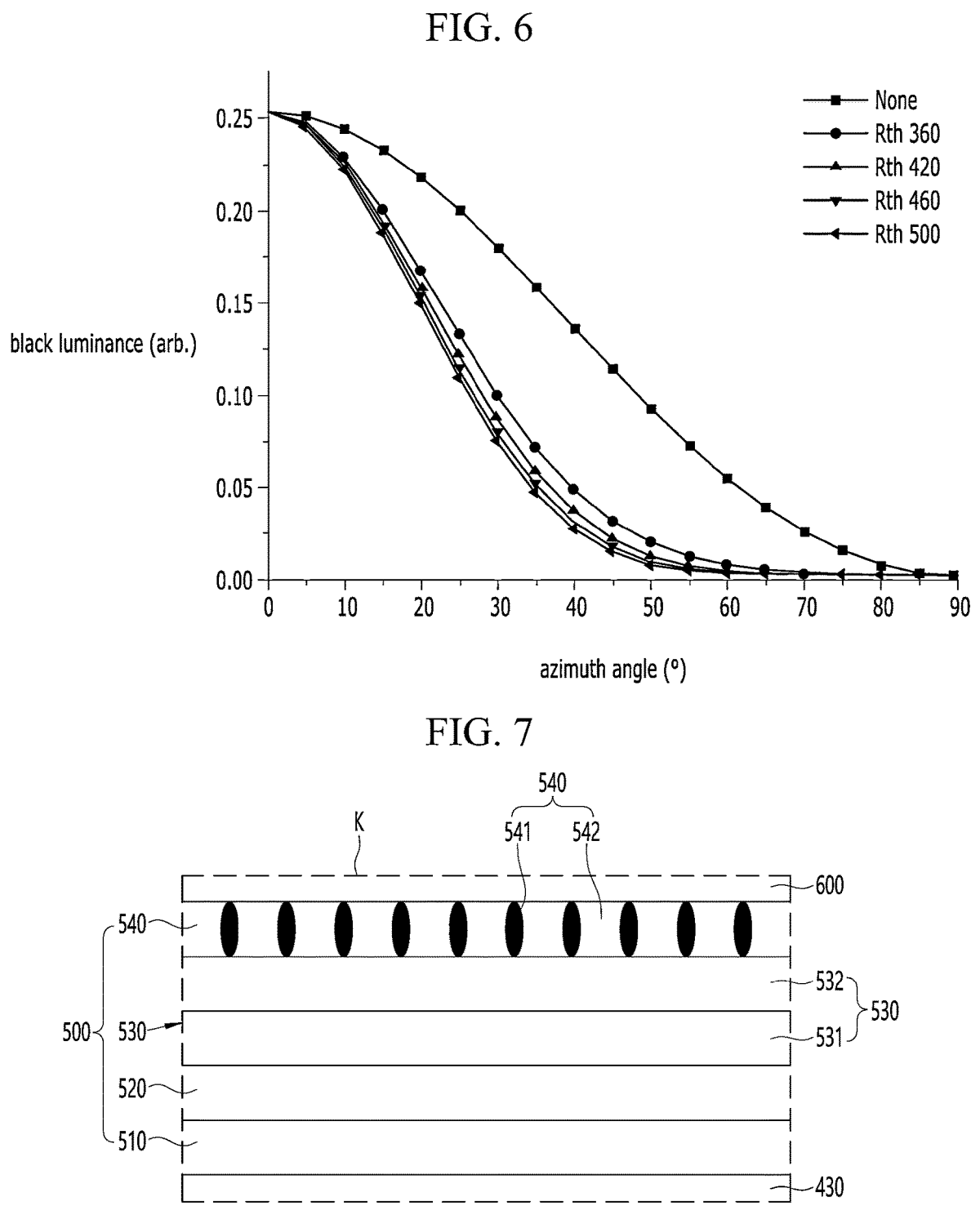

FIGS. 5 and 6 are graphs showing black luminance according to an azimuth angle depending on in-plane phase retardation value (Rin) or thickness direction phase retardation value (Rth) of the optical compensation layer made of a positive B plate in the display apparatus which does not include an optical compensation layer and the display apparatus according to the embodiment of the present disclosure;

Referring to FIGS. 5 and 6, the black luminance according to the azimuth can be greatly decreased in the display apparatus according to the embodiment of the present disclosure, which includes the optical compensation layer. For example, when the optical compensation layer 530 made of a positive B plate can have an in-plane phase retardation value (Rin) of 120 nm to 230 nm or a thickness direction phase retardation value (Rth) of 360 nm to 500 nm, the display apparatus according to the embodiment of the present disclosure can have a very low black luminance at the azimuth of 50° to 90°, as shown in FIGS. 5 and 6. For example, in the display apparatus according to the embodiment of the present disclosure, the viewing angle character- istics of the dichroic dye layer 540 can be compensated by the optical compensation layer 530 made of a positive B plate. Therefore, in the display apparatus according to the embodiment of the present disclosure, the narrow viewing angle can be effectively realized, without the occurrence of the Moire.

A cover substrate 600 can be disposed on the optical unit 500. The cover substrate 600 can prevent damage of the optical unit 500 due to the external impact and moisture. The cover substrate 600 can include an insulating material. The cover substrate 600 can include a transparent material. For example, the cover substrate 600 can include a glass or plastic. But embodiments of the present disclosure are not limited thereto.

Accordingly, the display apparatus according to the embodiment of the present disclosure can comprise the encapsulation unit 400 covering the light-emitting devices 300 and the optical unit 500 on the encapsulation unit 400, wherein the optical unit 500 can have a stacked structure of the anti-reflection layer 510, the linear polarizer 520, the optical compensation layer 530 and the dichroic dye layer 540, wherein the optical compensation layer 530 can include a positive B plate. Thus, in the display apparatus according to the embodiment of the present disclosure, the deteriora- tion of the image due to the reflection of the external light can be prevented by the anti-reflection layer 510 and the linear polarizer 520, the viewing angle of the light emitted from each light emitting device 300 can be restricted by the dichroic dye layer 540, and the viewing angle characteristics of the dichroic dye layer 540 can be compensated by the optical compensation layer 530. Therefore, in the display apparatus according to the embodiment of the present dis- closure, the quality of the image realized to have the narrow viewing angle can be improved, without the occurrence of Moire.

The display apparatus according to the embodiment of the present disclosure is described that the anti-reflection layer 510 can include only the ¼ wave plate. However, in the display device according to another embodiment of the present disclosure, the anti-reflection layer 510 can have various configurations. For example, in the display appara- tus according to another embodiment of the present disclo- sure, the anti-reflection layer 510 can have a stacked struc- ture of a ¼ wave plate and a ½ wave plate. The ½ wave plate can means a λ/2 phase retardation film or a half wave plate (HWP). Thus, in the display apparatus according to another embodiment of the present disclosure, the deterio- ration of the image due to the reflection of the external light can be effectively prevented.

The display apparatus according to the embodiment of the present disclosure is described that the optical compensation layer 530 has a single-layer structure. However, in the display apparatus according to another embodiment of the present disclosure, the optical compensation layer 530 can have a multi-layer structure. For example, in the display apparatus according to another embodiment of the present disclosure, the optical compensation layer 530 can have a stacked structure of a first optical compensation layer 531 and a second optical compensation layer 532, as shown in FIG. 7. The second optical compensation layer 532 can be disposed between the first optical compensation layer 531 and the dichroic dye layer 540. The second optical compen- sation layer 532 can be a retardation film having a different relationship of at least two of an in-plane refractive index in a first axis, an in-plane refractive index in a second axis different from the first axis, and a refractive index in a thickness direction, from the first optical compensation layer 531. At least one of the refractive index ratio (Nz), the in-plane phase retardation value (Rin) and the thickness direction phase retardation value (Rth) in the second optical compensation layer 532 can be different from that of the first optical compensation layer 531. For example, the first optical compensation layer 531 can include a negative B plate, and the second optical compensation layer 531 can include a positive B plate. Although discussed in terms of two optical compensation layers, the embodiments of the present disclosure are not limited thereto, and three or more optical compensation layers are within the scope of the present disclosure.

Figure 8:
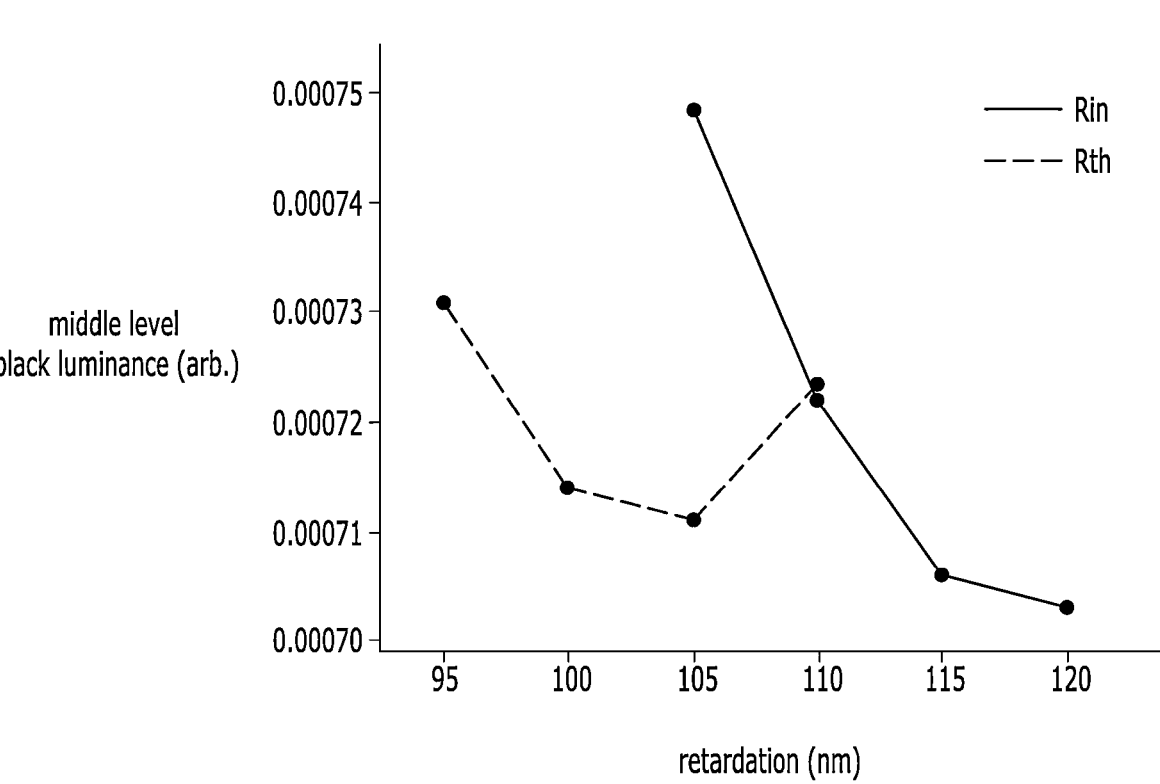
FIG. 8 is a view of graphs showing middle level black luminance according to the in-plane phase retardation value (Rin) and the thickness direction phase retardation value (Rth) of each of a first optical compensation layer made of a negative B plate and a second optical compensation layer made of a positive B plate in the display apparatus according to another embodiment of the present disclosure.
Figure 9:
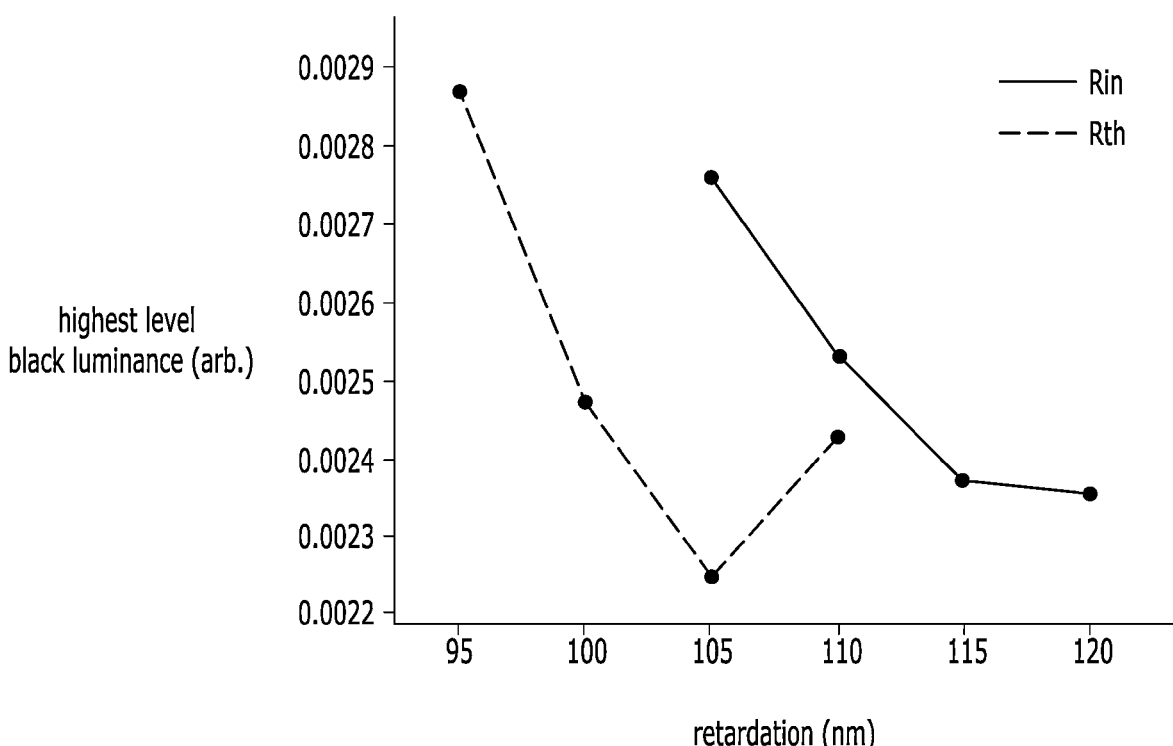
FIG. 9 is a view of graphs showing highest level black luminance according to the in-plane phase retardation value (Rin) and the thickness direction phase retardation value (Rth) of each of the first optical compensation layer made of a negative B plate and the second optical compensation layer made of a positive B plate in the display apparatus according to another embodiment of the present disclosure.

FIGS. 8 and 9 are graphs showing middle level black luminance or highest level black luminance according to the in-plane phase retardation value (Rin) and the thickness direction phase retardation value (Rth) of each of a first optical compensation layer 531 made of a negative B plate and a second optical compensation layer 532 made of a positive B plate in the display apparatus according to another embodiment of the present disclosure.

Referring to FIGS. 8 and 9, in the display apparatus according to another embodiment of the present disclosure, the middle level black luminance and the highest level black luminance can be greatly decreased, when each of the first optical compensation layer 531 made of a negative B plate and the second optical compensation layer 532 made of a positive B plate can have an in-plane phase retardation value (Rin) of 115 nm to 120 nm. Further, in the display apparatus according to another embodiment of the present disclosure, the middle level black luminance and the highest level black luminance can be minimized, when each of the first optical compensation layer 531 made of a negative B plate and the second optical compensation layer 532 made of a positive B plate can have a thickness direction phase retardation value (Rth) of 100 nm to 105 nm. For example, in the display apparatus according to another embodiment of the present disclosure, each of the first optical compensation layer 531 made of a negative B plate and the second optical compen- sation layer 532 made of a positive B plate can have the in-plane phase retardation value (Rin) of 115 nm to 120 nm and/or the thickness direction phase retardation value (Rth) of 100 nm to 105 nm. Thus, in the display apparatus according to another embodiment of the present disclosure, the quality of the image realized to have a narrow viewing angle can be effectively improved.

In the display apparatus according to another embodiment of the present disclosure, the first optical compensation layer 531 and the second optical compensation layer 532 can be configured in various ways. For example, in the display apparatus according to another embodiment of the present disclosure, the first optical compensation layer 531 can include a positive B plate, and the second optical compen- sation layer 532 can include a negative B plate. Further, in the display apparatus according to another embodiment of the present disclosure, the first optical compensation layer 531 can include a positive A plate, and the second optical compensation layer 532 can include a positive C plate.

Figure 10:
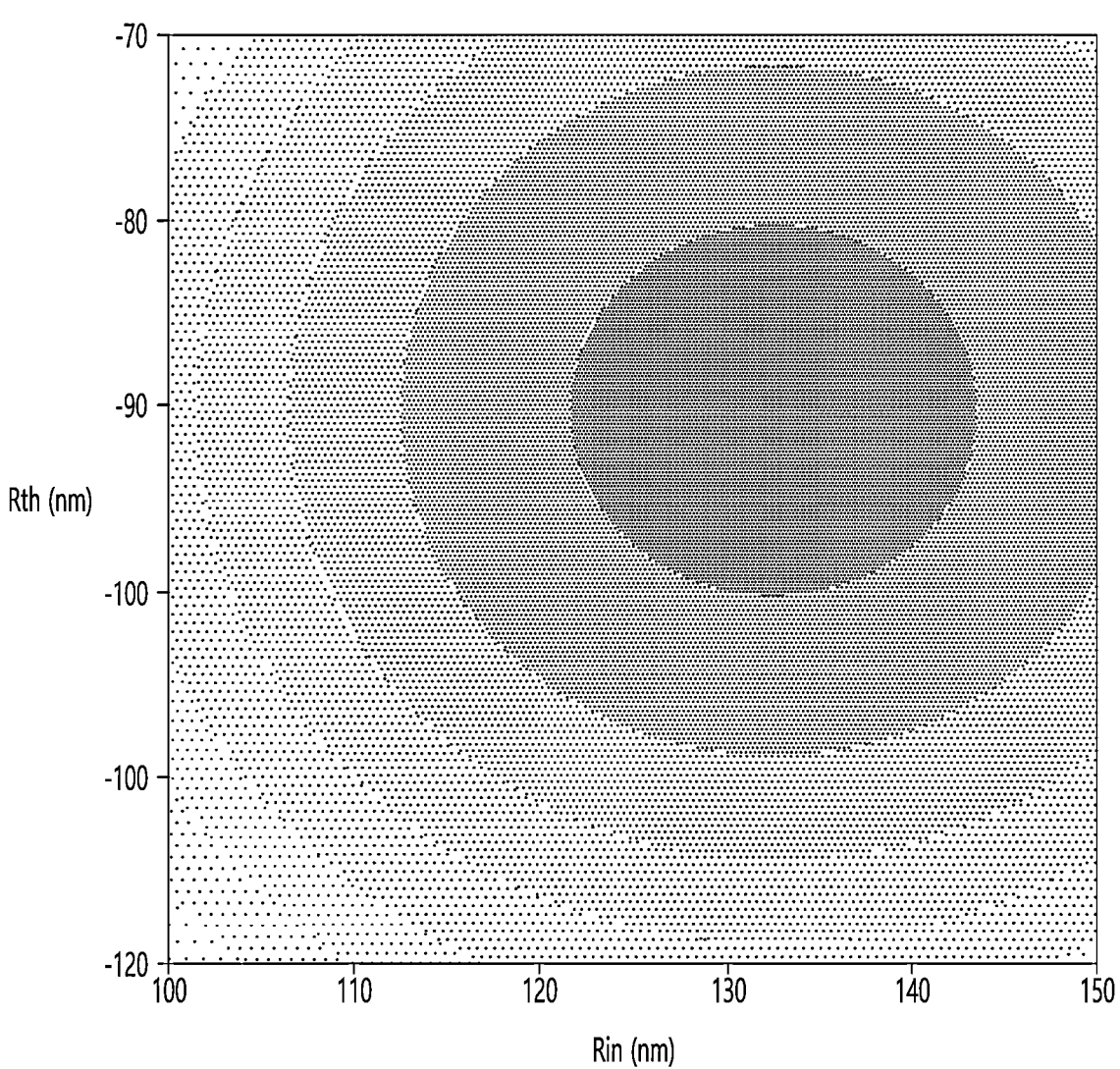
FIG. 10 is a view of a graph showing black luminance according to the in-plane phase retardation value (Rin) and the thickness direction phase retardation value (Rth) of each of the first optical compensation layer made of a positive A plate and a second optical compensation layer made of a positive C plate in the display apparatus according to another embodiment of the present disclosure.

FIG. 10 is a graph showing black luminance according to the in-plane phase retardation value (Rin) and the thickness direction phase retardation value (Rth) of each of the first optical compensation layer made 531 of a positive A plate and a second optical compensation layer 532 made of a positive C plate in the display apparatus according to another embodiment of the present disclosure. In FIG. 10, the shading is proportional to the black luminance. For example, in FIG. 10, a darkly shaded area means an area with low black luminance.

Referring to FIG. 10, in the display apparatus according to another embodiment of the present disclosure, the black luminance can be minimized, when each of the first optical compensation layer 531 made of a positive A plate and the second optical compensation layer 532 made of a positive C plate can have an in-plane phase retardation value (Rin) of 125 nm to 145 nm. Further, in the display apparatus according to another embodiment of the present disclosure, the black luminance can be minimized, when each of the first optical compensation layer 531 made of a positive A plate and the second optical compensation layer 532 made of a positive C plate can have a thickness direction phase retardation value (Rth) of 80 nm to 100 nm. For example, in the display apparatus according to another embodiment of the present disclosure, each of the first optical compensation layer 531 made of a positive A plate and the second optical compensation layer 532 made of a positive C plate can have an in-plane phase retardation value (Rin) of 125 nm to 145 nm and/or a thickness direction phase retardation value (Rth) of 80 nm to 100 nm. Thus, in the display apparatus according to another embodiment of the present disclosure, the quality of the image realized to have a narrow viewing angle can be effectively improved.

Although FIG. 10 is discussed in terms of the first optical compensation layer 531 including the positive A plate and the second optical compensation layer 532 including the positive C plate, embodiments of the present disclosure are not limited thereto. For example, in other embodiment of the present disclosure, the first optical compensation layer 531 can include the positive C plate and the second optical compensation layer 532 can include the positive A plate. Accordingly, of the positive C plate and the positive A plate, the positive A plate can be placed closer to the dichroic dye layer 540 than the positive C plate in other embodiments of the present disclosure.

Additionally, although the embodiments of the present disclosure are discussed in terms of a positive A plate, a positive B plate, a positive C plate, and a negative B plate, embodiments of the present disclosure are not limited thereto, and other plates can also be used, such as a negative A plate and a negative C plate. In various embodiments of the present disclosure, thicknesses of the positive A plate, the positive B plate, the positive C plate, the negative A plate, the negative B plate and the negative C plate can be different. For example, a thickness of the positive B plate can be greater than that of the positive A plate, which can be greater than that of the positive C plate.

In various embodiments of the present disclosure, the optical compensation layer 530 can include at least one plate among a positive A plate, a positive B plate, a positive C plate, a negative A plate, a negative B plate and a negative C plate. Also, when two or more plates are included in the optical compensation layer 530, various combination of the plates can be provided. Such combinations of plates can include a combination of the positive B plate and the negative B plate, a combination of the positive A plate and the positive C plate, and the combination of the positive B plate and a negative C plate, among others. When the combinations of the plates are provided in the optical compensation layer 530, any one of the positive A plate, the positive B plate, the positive C plate, the negative A plate, the negative B plate and the negative C plate can be one located closer to the dichroic dye layer 540.

Figure 11:
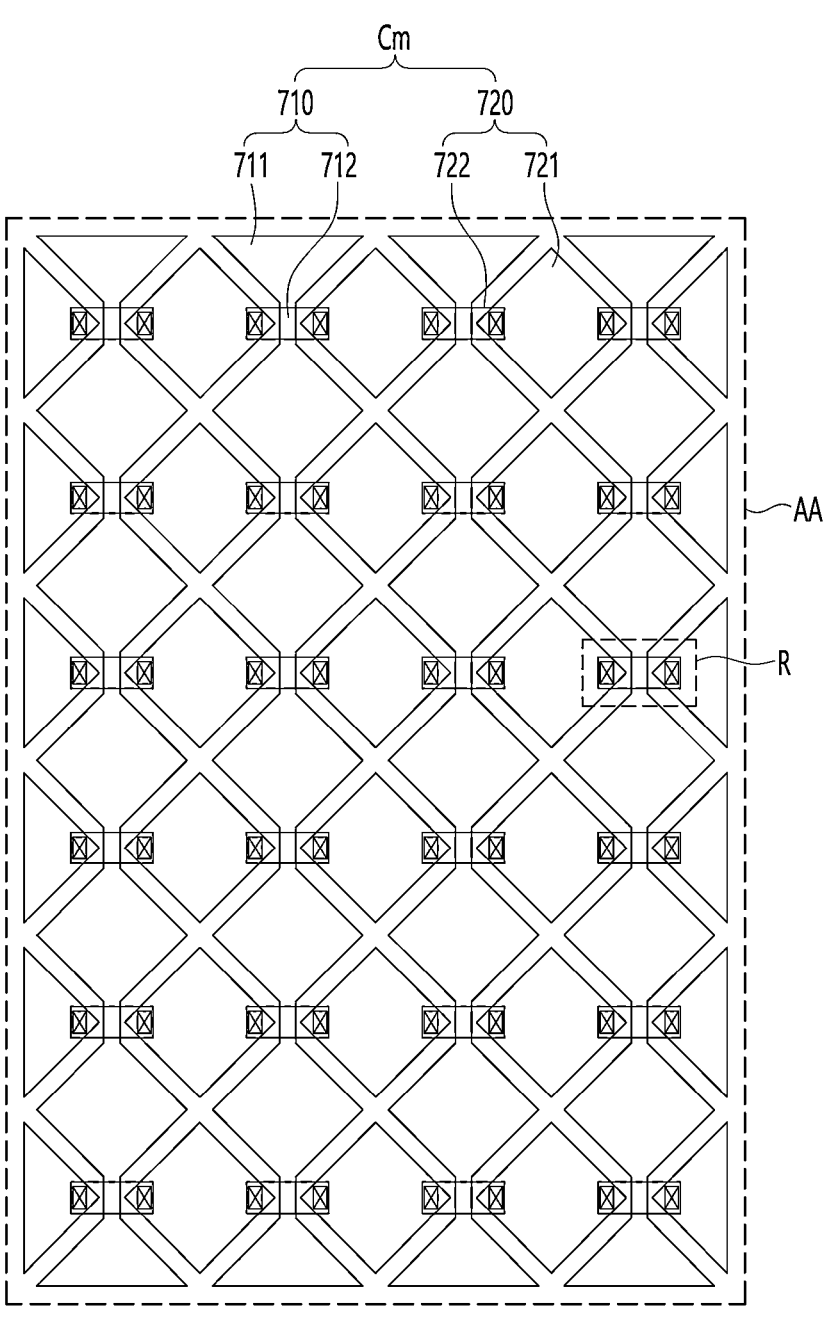
FIGS. 11 to 13 are views showing the optical compensation layer in the display apparatus according to further another embodiment of the present disclosure.
Figure 12:
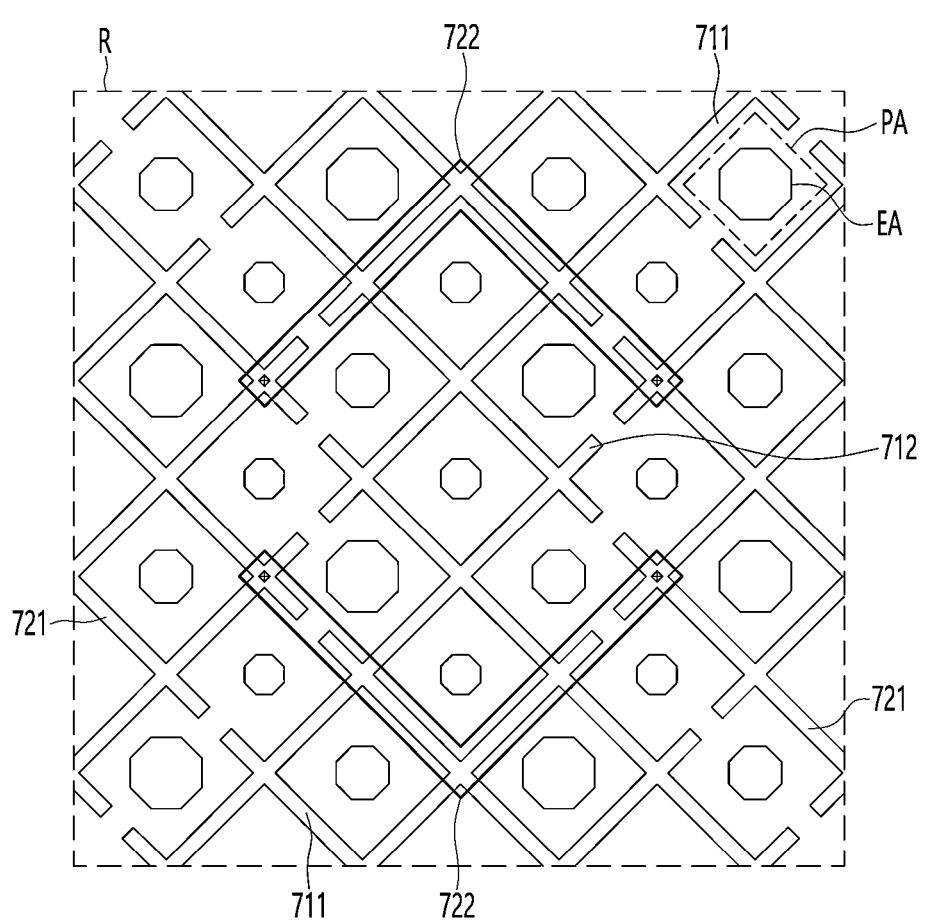
Figure 13:
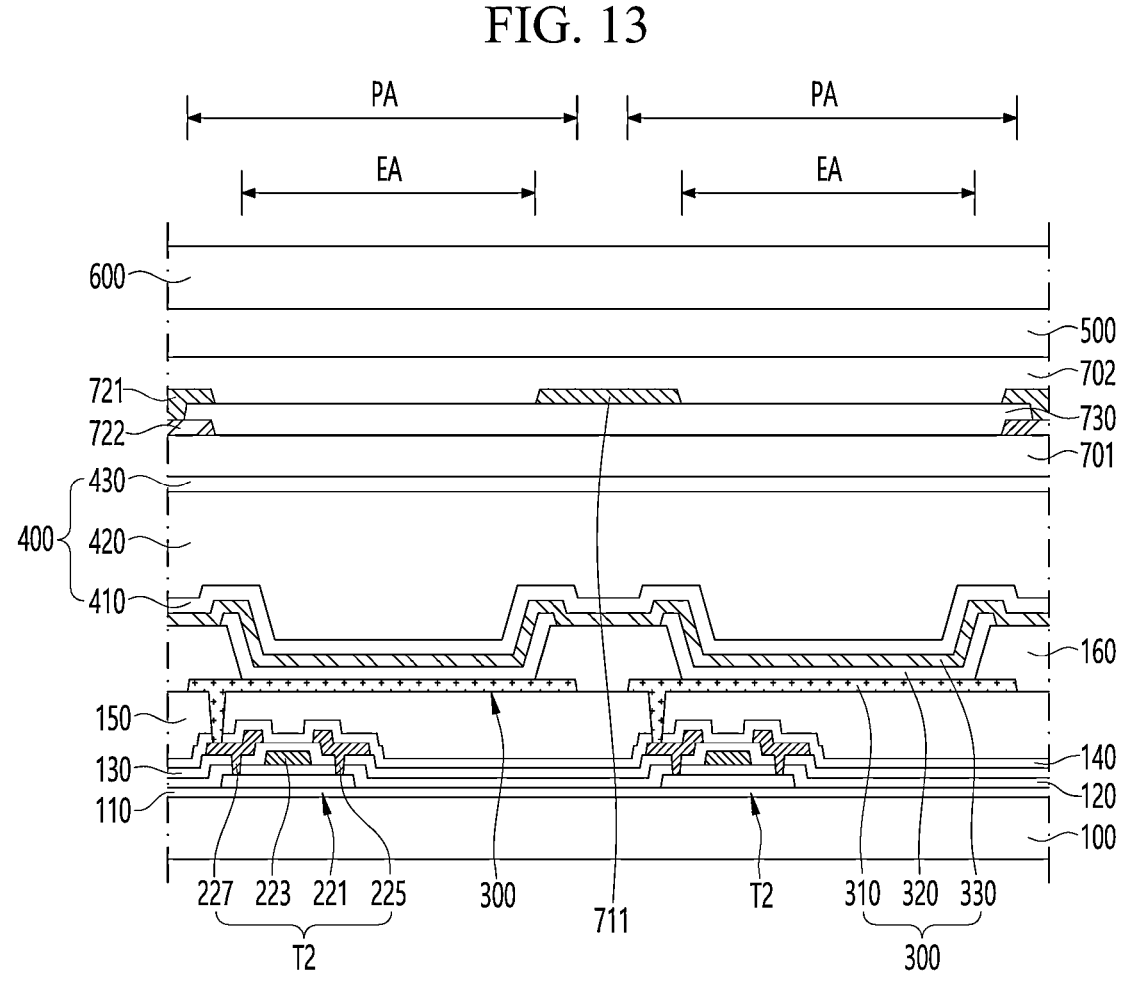

The display apparatus according to the embodiment of the present disclosure is described that the optical unit 500 is in direct contact with the encapsulation unit 400. However, in the display apparatus according to another embodiment of the present disclosure, a touch sensor Cm can be disposed between the encapsulation unit 400 and the optical unit 500, as shown in FIGS. 11 to 13. The touch sensor Cm can sense a touch of the user and/or a tool. For example, the touch sensor Cm can include driving touch lines 710 in which a touch driving signal is applied and sensing touch lines 720 in which a touch sensing signal is applied.

Each of the driving touch lines 710 can include first touch electrodes 711 and first bridge electrodes 712. The first bridge electrodes 712 can electrically connect between the first touch electrodes 711. For example, each of the driving touch lines 710 can include the first touch electrodes 711 electrically connected in a direction by the first bridge electrodes 712.

Each of the sensing touch lines 720 can include second touch electrodes 721 and second bridge electrodes 722. The second touch electrodes 721 can be disposed between the first touch electrodes 711. For example, the first touch electrodes 711 and the second touch electrodes 721 can be alternately arranged. Thus, the display apparatus according to another embodiment of the present disclosure can sense the touch of the user and/or the tool by using the driving touch lines 710 and the sensing touch lines 720.

The second bridge electrodes 722 can electrically connect between the second touch electrodes 721. The second touch electrodes 721 can be connected by the second bridge electrodes 722 in a direction perpendicular to the first touch electrodes 711. For example, each of the sensing touch lines 720 can cross the driving touch lines 710. Each of the second bridge electrodes 722 can intersect one of the first bridge electrodes 712. The second bridge electrodes 722 can be disposed on a layer different from the first bridge electrodes 712. For example, in the display apparatus according to another embodiment of the present disclosure, a touch buffer layer 701 can be disposed on the encapsulation unit 400, the second bridge electrodes 722 can be disposed on the touch buffer layer 701, the first touch electrodes 711, the second touch electrodes 721 and the first bridge electrodes 712 can be disposed on a touch insulating layer 730 covering the second bridge electrodes 722, and the optical unit 500 can be disposed on a touch passivation layer 702 covering the first touch electrodes 711, the second touch electrodes 721 and the first bridge electrodes 712. The touch buffer layer 701, the touch insulating layer 730 and the touch passivation layer 702 can include an insulating material. For example, the touch buffer layer 701, the touch insulating layer 730 and the touch passivation layer 702 can include an inorganic insulating material, such as silicon oxide (SiOx) and silicon nitride (SiNx). The touch buffer layer 701, the touch insulating layer 730 and the touch passivation layer 702 can include different materials.

The first touch electrodes 711, the first bridge electrodes 712, the second touch electrodes 721 and the second bridge electrodes 722 can include a conductive material. The first touch electrodes 711, the first bridge electrodes 712, the second touch electrodes 721 and the second bridge electrodes 722 can include a material having a relatively low resistance. For example, The first touch electrodes 711, the first bridge electrodes 712, the second touch electrodes 721 and the second bridge electrodes 722 can include a metal, such as copper (Cu), molybdenum (Mo), titanium (Ti) and tantalum (Ta). But embodiments of the present disclosure are not limited thereto.

The first touch electrodes 711, the first bridge electrodes 712, the second touch electrodes 721 and the second bridge electrodes 722 can be disposed in the display area AA. The emission area EA of each pixel area PA defined by the bank insulating layer 160 can be disposed between the first touch electrodes 711, the first bridge electrodes 712, the second touch electrodes 721 and the second bridge electrodes 722. For example, the first touch electrodes 711, the first bridge electrodes 712, the second touch electrodes 721 and the second bridge electrodes 722 can overlap the bank insulating layer 160. A plane of each first touch electrode 711 and a plane of each second touch electrode 721 can have a mesh shape including openings overlapping with the emission area EA of each pixel area PA. Thus, in the display apparatus according to another embodiment of the present disclosure, the accuracy of the touch sensing using the touch sensor Cm can be improved, and the decrease in light-extraction efficiency due to the driving touch lines 710 and the sensing touch lines 720 can be minimized. Further, in the display apparatus according to another embodiment of the present disclosure, a traveling direction of the light emitted from each light-emitting device 300 can be restricted by the driving touch lines 710 and the sensing touch lines 720. Therefore, in the display apparatus according to another embodiment of the present disclosure, the touch of the user and/or the tool can be accurately sensed, and the quality of the image realized to have a narrow viewing angle can be improved.

In the result, the display apparatus according to the embodiments of the present disclosure can comprise the optical unit on the encapsulation unit covering the light-emitting devices, wherein the optical unit can have the linear polarizer on the anti-reflection layer, the dichroic dye layer on the linear polarizer, and the optical compensation layer between the linear polarizer and the dichroic dye layer. Thus, in the display apparatus according to the embodiments of the present disclosure, the viewing angle of the light emitted from each light emitting device can be restricted by the dichroic dye layer, and the viewing angle characteristics of the dichroic dye layer can be compensated by the optical compensation layer. For example, in the display apparatus according to the embodiments of the present disclosure, the narrow viewing angle can be realized, without the occurrence of Moire. Thereby, in the display apparatus according to the embodiments of the present disclosure, the quality of the image realized to have the narrow viewing angle can be improved.

What is claimed is:

1. A display apparatus comprising:
   a light-emitting device on a device substrate;
   an encapsulation unit on the device substrate, the encapsulation unit covering the light-emitting device;
   an anti-reflection layer on the encapsulation unit;
   a dichroic dye layer on the anti-reflection layer, the dichroic dye layer including dyes vertically arranged;
   a linear polarizer disposed between the anti-reflection layer and the dichroic dye layer; and
   a first optical compensation layer disposed between the linear polarizer and the dichroic dye layer.

2. The display apparatus according to claim 1, wherein the anti-reflection layer includes a ¼ wave plate.

3. The display apparatus according to claim 1, wherein the first optical compensation layer includes a positive B plate.

4. The display apparatus according to claim 3, wherein an in-plane phase retardation value (Rin) of the first optical compensation layer is approximately 120 nm to 230 nm.

5. The display apparatus according to claim 3, wherein a thickness direction phase retardation value (Rth) of the first optical compensation layer is approximately 360 nm to 500 nm.

6. The display apparatus according to claim 1, further comprising a second optical compensation layer disposed between the first optical compensation layer and the dichroic dye layer.

7. The display apparatus according to claim 6, wherein the second optical compensation layer is a retardation film having a different relationship of at least two of an in-plane refractive index in a first axis, an in-plane refractive index in a second axis different from the first axis, and a refractive index in a thickness direction, from the first optical compensation layer.

8. The display apparatus according to claim 6, wherein the first optical compensation layer includes a negative B plate, and the second optical compensation layer includes a positive B plate.

9. The display apparatus according to claim 8, wherein an in-plane phase retardation value (Rin) of each of the first optical compensation layer and the second optical compensation layer is approximately 115 nm to 120 nm.

10. The display apparatus according to claim 8, wherein a thickness direction phase retardation value (Rth) of each of the first optical compensation layer and the second optical compensation layer is approximately 100 nm to 105 nm.

11. The display apparatus according to claim 6, wherein the first optical compensation layer includes a positive A plate, and the second optical compensation layer includes a positive C plate.

12. The display apparatus according to claim 11, wherein an in-plane phase retardation value (Rin) of each of the first optical compensation layer and the second optical compensation layer is approximately 125 nm to 145 nm.

13. The display apparatus according to claim 11, wherein a thickness direction phase retardation value (Rth) of each of the first optical compensation layer and the second optical compensation layer is approximately 80 nm to 100 nm.

14. A display apparatus comprising:
   a light-emitting device on a device substrate;
   a linear polarizer on the light-emitting device of the device substrate;
   at least one of an encapsulation unit and a touch sensor disposed between the light-emitting device and the linear polarizer,
   a dichroic dye layer on the linear polarizer, the dichroic dye layer including dyes vertically arranged; and
   a first optical compensation layer disposed between the linear polarizer and the dichroic dye layer.

15. The display apparatus according to claim 14, further comprising a second optical compensation layer disposed between the first optical compensation layer and the dichroic dye layer.

16. The display apparatus according to claim 15, wherein the first optical compensation layer includes one of a positive B plate and a negative B plate, and the second optical compensation layer includes the other of the positive B plate and the negative B plate.

17. The display apparatus according to claim 15, wherein the first optical compensation layer includes one of a positive A plate and a positive C plate, and the second optical compensation layer includes the other of the positive A plate and the positive C plate.

18. The display apparatus according to claim 15, wherein the first optical compensation layer includes one of a positive B plate and a negative C plate, and the second optical compensation layer includes the other of the positive B plate and the negative C plate.

19. The display apparatus according to claim 14, wherein the first optical compensation layer includes a positive B plate.

20. The display apparatus according to claim 14, further comprising an anti-reflective layer disposed between the encapsulation unit and the linear polarizer, wherein the touch sensor is disposed between the encapsulation unit and the anti-reflective layer.

* * * * *